United States Patent [19]
Belt et al.

[11] Patent Number: 4,782,467
[45] Date of Patent: Nov. 1, 1988

[54] RADIATION HARD GATED FEEDBACK MEMORY CELL

[75] Inventors: Ronald A. Belt, Plymouth; Gary D. Havey, St. Anthony; Dale Berndt, Plymouth, all of Minn.

[73] Assignee: Honeywell Inc., Minneapolis, Minn.

[21] Appl. No.: 102,304

[22] Filed: Sep. 25, 1987

Related U.S. Application Data

[63] Continuation-in-part of Ser. No. 781,421, Sep. 30, 1985, abandoned.

[51] Int. Cl.$^4$ ............................................. G11C 11/40
[52] U.S. Cl. .................................... 365/154; 365/190; 307/279
[58] Field of Search ................. 365/154, 156, 190; 307/279, 291

[56] References Cited

U.S. PATENT DOCUMENTS

| | | | |
|---|---|---|---|
| 2,909,678 | 10/1959 | Jensen | 307/247 R |
| 3,178,584 | 4/1965 | Clark | 307/291 |
| 3,621,303 | 11/1969 | Jonjallaz | 307/292 |
| 3,678,300 | 7/1972 | Keller | 307/288 |
| 3,912,950 | 10/1975 | Tada | 307/289 |
| 3,973,246 | 8/1976 | Millhollan et al. | 365/154 |
| 4,128,773 | 12/1978 | Troutman et al. | 365/156 |
| 4,130,892 | 12/1978 | Gunckel, II et al. | 365/154 |
| 4,270,062 | 5/1981 | Hanna | 307/272 |
| 4,322,820 | 3/1982 | Toyoda | 365/154 |
| 4,400,712 | 8/1983 | O'Connor | 365/156 X |

Primary Examiner—Joseph A. Popek
Attorney, Agent, or Firm—John G. Shudy, Jr.

[57] ABSTRACT

Pairs of cross coupled transistors are configured as a bistable regenerative circuit. Isolation means, such as diodes or transistors, are provided in the cross coupling paths to ensure that if the logic state of one transistor is temporarily changed by radiation striking the circuit, the logic state of the other transistor it is paired with will not change and the logic state of the unchanged transistor will be utilized to maintain the logic state of the other pair of transistors. CML, DTL and SDFL circuits are disclosed as the preferred embodiments.

30 Claims, 3 Drawing Sheets

DTL CELL

Fig. 3
DTL CELL

Fig. 4
COMPLETE DTL CELL

Fig. 5
SDFL CELL

Fig. 6

CML CELL

RADIATION HARD GATED FEEDBACK MEMORY CELL

This application is a continuation-in-part of application Ser. No. 781,421, filed Sept. 30, 1985, now abandoned.

BACKGROUND OF THE INVENTION

1. Field of the Invention

This invention relates to bistable regenerative solid state memory cells, and particularly to such cells where redundant elements are employed to protect the logic state of the cell against upset due to radiation.

2. Related Art

Figure 1:
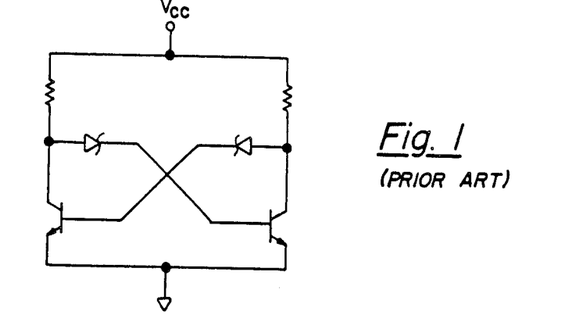
FIG.1 is a prior art solid state regenerative bistable cell.

FIG. 1 shows a basic known solid state bistable regenerative memory cell. Random access memories (RAMs) use a matrix of such cells, each adapted to be uniquely written into or read.

Radiation, such as alpha particles or cosmic rays, cause transients in memory cells as they penetrate into the cell. These transients can trigger the bistable circuit by changing the current or voltage at a transistor node thereby causing the cell to switch logic states.

In bipolar memory cells, the causes of such radiation-induced upset are primarily (1) collector nodes of OFF transistors can short to ground, and (2) base nodes of OFF transistors can short to collector nodes turning OFF transistors ON. The first mechanism is the dominant cause of single event upset (SEU) in cosmic ray environments. This mechanism, with small variations in charge collection volume and circuit upset threshold, is also found in other semiconductor technologies such as N-channel metal oxide semiconductor/silicon (NMOS/Si) and complementary metal oxide semiconductor/silicon (CMOS/Si).

The second upset mechanism is found only in bipolar devices. Here a parasitic current path is formed within the device itself rather than between the device and the substrate. The second upset mechanism involves a smaller amount of upset charge which can still cause upset at high LET values (LET denotes linear energy transfer, which is the amount of energy deposited in the semiconductor by the radiation). It is estimated that if the first upset mechanism is eliminated completely, then the second upset mechanism will still limit the error rate to about 1E-7 (i.e., $1 \times 10^{-7}$) errors per bit-day.

Various techniques have been proposed for hardening bipolar circuits to SEU. However, all of these techniques address only the first type of upset mechanism listed above. They propose to either remove the collector from electrical contact with the substrate or reduce the charge injected into the collector node. The most effective of these other techniques—dielectric isolation—completely isolates the collector from the substrate.

Eliminating SEU-induced collector-to-base shorts is much more difficult. Pulse rise time can be used to discriminate SEU currents from normal device currents. This forms the basis for CMOS hardening by means of cross-coupled resistors or extra capacitance. But this technique degrades the speed of bipolar circuits so much that they lose their competitive advantage against CMOS.

Photocurrent compensation techniques are also ineffective against the second form of SEU because the upset current varies with the direction of ion incidence. Geometric effects practically rule out the location of a second charge collection region which can produce an equal but oppositely directed photocurrent from the same ion path. Finally, circumvention techniques are almost totally ineffective because of the difficulty of sensing a time-random ion event at every transistor node and recovering fast enough (e.g., 0.2 ns) to prevent an upset.

A bit error rate of 1E-10 error/bit-day is being sought for memory elements in a cosmic ray environment. This corresponds to approximately three years without an error for a one megaword memory. Only one technology complementary metal oxide semiconductor/silicon on sapphire (CMOS/SOS) can meet this goal at present, but CMOS/bulk silicon is constantly being improved and may be able to meet this goal in the near future. No bipolar technology, however, can approach this goal.

Ever more stringent error/bit-day rates are highly desirable with the enormous increase in memory capacity being projected for general purpose computers. In a general purpose computer an error in the register bit or memory bit can be retained and used in a number of calculations. If the bit is a critical value, the consequences of even one error can be disastrous.

It is thus highly desirable to have a memory cell which is extremely resistant to both types of SEU. It is further highly desirable to have such a cell which is adaptable to either unipolar or bipolar transistor circuits.

SUMMARY OF THE INVENTION

The present invention is a bistable solid state regenerative memory cell wherein redundant switching means, such as bipolar or unipolar transistors, are connected in a cross-coupled arrangement. Each transistor has a load connected between the transistor and a voltage referenced current source. Means to control the current or voltage applied to the base or control gate of each transistor is provided between such base or control gate and the collector (or drain) of the other transistor to which it is cross coupled.

Transistors are the preferred control means. Read and write circuitry is readily provided to allow the cell to be incorporated in a RAM or a logic array.

The redundant transistors and diodes serve to retain the logic state of the cell despite an SEU occurring at the collector (or drain) of one of the transistors

DESCRIPTION OF THE PREFERRED EMBODIMENT

Figure 2:
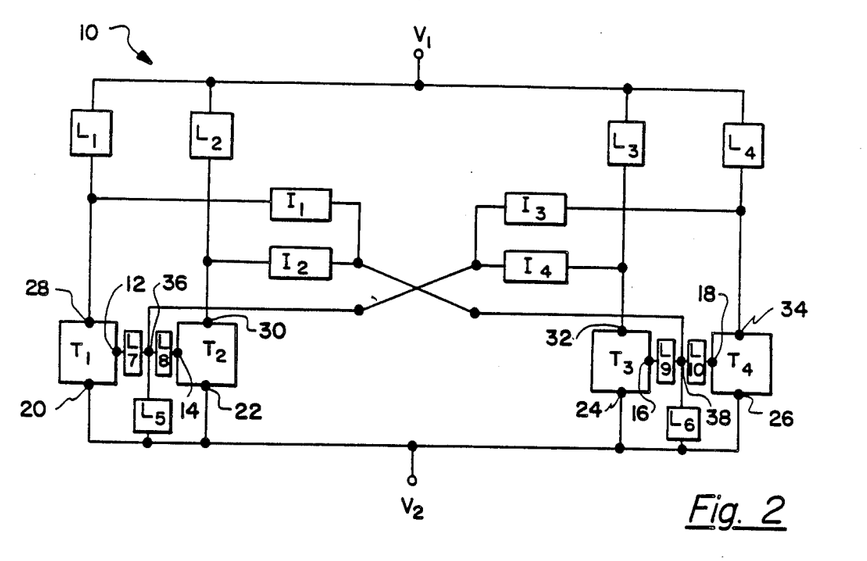
FIG. 2 is a generalized schematic of the present invention.

FIG. 2 shows the present invention, i.e., a solid state memory cell 10.

Two cross coupled pairs of switching means, such as transistors, are shown as T1/T2 and T3/T4. Each transistor includes a control region (i.e., 12, 14, 16 and 18)

which is either the gate of a field effect transistor or the base of a bipolar transistor. The control region in each transistor controls the voltage or flow of current between a first region (i.e., 20, 22, 24 and 26) and a second region (i.e., 28, 30, 32 and 34) of each transistor.

Load means $L_1$, $L_2$, $L_3$ and $L_4$ are connected between a first voltage reference point $V_1$ and second regions 28, 30, 32 and 34, respectively.

Isolation means $I_1$, $I_2$, $I_3$ and $I_4$ for controlling the voltage or current applied to the control regions are connected, respectively, between second region 28 and control region 16, second region 30 and control region 18, second region 34 and control region 12 and second region 32 and control region 14.

Load means $L_5$ may be provided between common base node 36 and a second voltage reference point $V_2$. Similarly, load means $L_6$ may be provided between common base node 38 and second voltage reference point $V_2$. Load means $L_5$ and $L_6$ are important to the WRITE process when the transistors are bipolar. Writing into the cell will be discussed further below.

Load means $L_7$, $L_8$, $L_9$ and $L_{10}$ are each connected between the control regions of one of the transistors and their respective cross coupling isolation means. These further harden the circuit against radiation and will be discussed further below.

Note that nodes 36 and 38 are convenient points for connecting a WRITE means.

Operation of cell 10 (FIG. 2) is as follows. Assume that $T_1$ and $T_2$ are ON, and $T_3$ and $T_4$ are OFF. The voltages at the second regions 28 and 30 are low (e.g., a logic 0) since $T_1$ and $T_2$ are in their low impedance state. The current through $I_1$ and $I_2$ is insufficient, therefore, to raise the potentials of control regions 16 and 18 enough to switch ON either $T_3$ or $T_4$. Thus $T_3$ and $T_4$ remain OFF. In turn, the second regions 32 and 34 are high (e.g., logic 1). $I_3$ and $I_4$ are devices which will provide sufficient voltage or current to control regions 12 and 14, respectively, to keep $T_1$ and $T_2$ ON when second regions 32 and 34 respectively are in a high state. Since $I_3$ and $I_4$ are connected in common at node 36, if either $I_3$ or $I_4$ are providing sufficient voltage, or current, then both $T_1$ and $T_2$ will be ON. Similarly, due to their common connection at node 38, either $I_1$ or $I_2$ will provide sufficient voltage or current to keep $T_3$ and $T_4$ ON if either node 28 or node 30, respectively, is in a high state.

If the transistors in FIG. 2 are bipolar, the electrical signals controlling them will be currents transmitted through the isolation means $I_1$ through $I_4$ to their respective base regions. If transistors in FIG. 2 are FETs, the electrical signals transmitted by the isolation means $I_1$ through $I_4$ will be voltages applied to their respective gate regions.

Consider the invention if the memory cell is hit by a single event pulse. For example, in DTL circuit 40 of FIG. 3, assume that initially $T_3$ and $T_4$ are OFF, and that $T_3$ is hit by a heavy ion which funnels charge into its collector node 32. Then collector node 32 is pulled to ground. Diode $I_4$ gets reverse-biased, isolating node 32 from the rest of the circuit. Diode $I_3$, however, stays forward-biased maintaining the base current of $T_1$ and $T_2$. Thus $T_1$ and $T_2$ stay ON, the collector nodes 28 and 30 of $T_1$ and $T_2$, respectively, stay low and diodes $I_1$ and $I_2$ remain reverse-biased. Transistor $T_4$ stays OFF, ensuring that the state of the cell is not changed.

Figure 3:
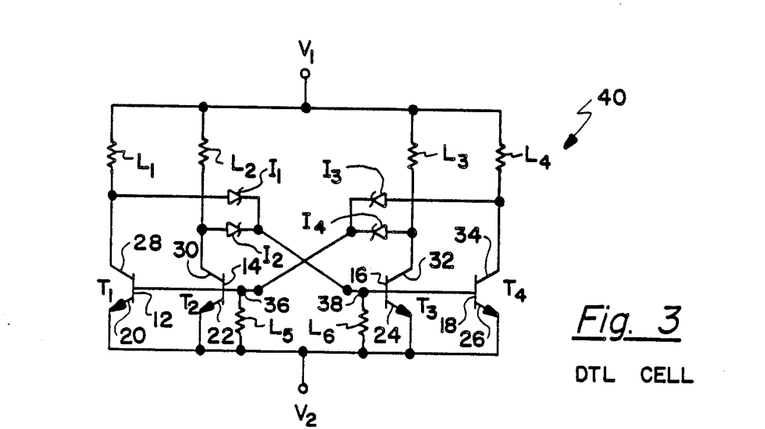
FIG. 3 is a diode transistor logic (DTL) version of the present invention.

As soon as the transient charge on collector node 32 of $T_3$ is dissipated (e.g., 0.5 ns) the potential at collector 32 rises to the same level as collector 34 of $T_4$. Cell 40 has thus survived an SEU event with its information intact with only the appearance of a transient state which may or may not be observed on later readout.

Figure 4:
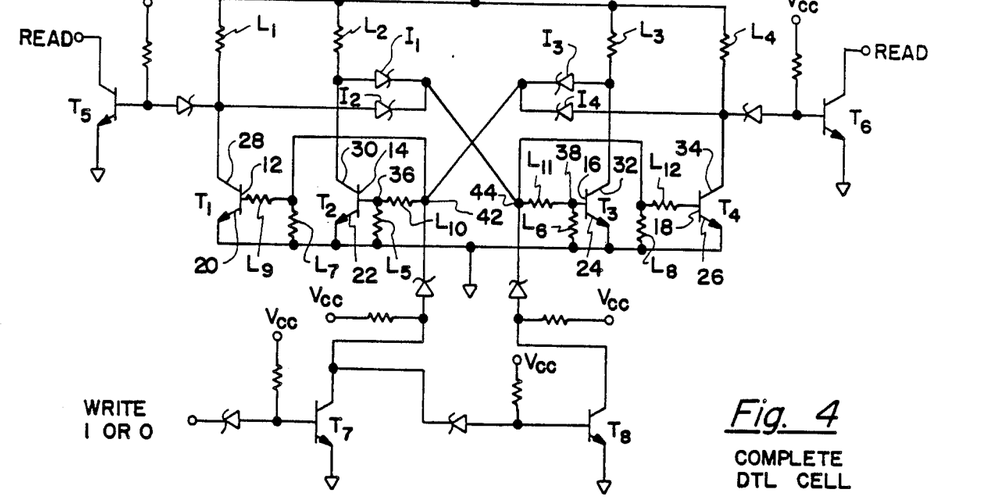
FIG. 4 is the cell of FIG. 3 with read and write circuitry added.

Readout from the cell can be accomplished by numerous convenient means. For example, for cell 40 one could use (a) Schottky diodes coupled to collector nodes, (b) multiple emitters on transistors or (c) Schottky diodes coupled to base nodes. FIG. 4 shows scheme (a) with transistors $T_5$ and $T_6$ coupled to regions 28 and 34, respectively.

It is not necessary to sample both current paths on each side of the flip-flop for readout. If a single event pulse affects one current path while readout is being accomplished on the other path, the event will go unnoticed and the correct logic state will result. If a single event pulse affects the same current path that is used for readout, the effect is the same as if a single event pulse hit one of the transistors in the logic chain between the cell and a following register or output pin. Therefore, there is little reason to harden one part of the chain unless the other (larger) part of the chain is hardened also. Voting on three successive readouts of the cell will eliminate all errors incurred during cell readout, both inside and outside the cell.

Writing the cell requires forcing a current into the base node of the OFF transistors which is larger than the base current provided inside the cell to the ON transistors. This is accomplished, conveniently, with transistors $T_7$ and $T_8$ coupled, respectively, to nodes 42 and 44 as shown in FIG. 4. The time for the cell to switch from one state to another is related to the time required to pull charge out of the base regions of the initially ON transistors (e.g. $T_3$ and $T_4$). When the initially OFF transistors are switched ON by the externally supplied base current pulse, the diodes on the collectors of these transistors become reversed-biased. This means that there is no way for the base charge of the initially ON transistors to be withdrawn unless one supplies a leakage path ground. This is accomplished (in FIG. 4) by base pull-down load means $L_5$, $L_6$, $L_7$ and $L_8$.

The cell must be accessed from both sides in order to WRITE both states successfully. This means that somewhere in the WRITE circuit there is a possibility of single-point failure. This failure can result in an incorrect state being written into the cell. In FIG. 4, the single point of failure occurs on the means whereby current is diverted from the base of transistors $T_7$ and $T_8$.

Consideration of errors which occur in the WRITE mode leads one to the conclusion that it is not effective to harden just the few transistors adjacent to the storage cell unless all transistors in the logic chain leading into the cell are hardened to near the same level. This follows because all the transistors in the logic chain have the same duration of susceptibility (the path delay time) and all are likely to have the same critical charge and critical time. Therefore, the probability of upset is approximately the same. This means that hardening the last N of M susceptible transistors in the logic chain will result in a reduction of the critical volume, and enhance the SEU error rate, by a factor N/M.

In order to harden the cell against SEU induced collector-base shorts, load means $L_9$, $L_{10}$, $L_{11}$ and $L_{12}$ are preferably employed. Even though the transistors $T_1$ through $T_4$ are placed in separate isolation regions, the transistors on one side of the cell share a common base node. Therefore, collector-base current from one transistor can affect the base current of the other transistor on the same side of the cell, turning both OFF transistors ON at the same time. This can be alleviated by adding base resistors such as load means $L_9$ through $L_{12}$ as shown in FIGS. 2 and 4. Ion-produced single event upset currents from one transistor must go through both resistors (e.g. $L_9$ and $L_{10}$) before affecting the second transistor on the same side of the cell. This is a modified version of cross coupled resistors, which in the past has not been very effective for bipolar SEU hardening. But in the present cell the collector-substrate component of upset current cannot produce upset, and the collector-base component is much smaller than the normal collector-substrate component. Therefore, the resistor values can be relatively small and the circuit is not slowed very much.

A final improvement which is highly desirable to harden the cell against SEU is to provide isolation means and load means which are inherently not susceptible to SEU. If they are susceptible, SEU could inject current into the base of both OFF transistors on one side of the cell, turning them both ON. Load means $L_5$ through $L_{12}$ and isolation means $I_1$ through $I_4$ are the most important means to be hardened against SEU. Hardening of these elements of the cell can be accomplished by providing thin film polysilicon resistors as the load means and using an implanted dielectric under Schottky diodes as the isolation means.

By itself, the gated feedback cell of course only part of an integrated circuit. For a complete circuit, this cell can be embedded in either a RAM, an edge-triggered flip-flop, or a register file (which is an array of edge-triggered flip-flops.) The area penalty for RAM design is approximately 100%. The area penalty for an edge-triggered flip-flop can be as low as 25% if only the output latch is protected. This may be possible in the edge-triggered flip-flop scheme because the remainder of the edge-triggered flip-flop is used only during the input operation. This makes the cell of the present invention an attractive solution for register files and stand alone flip-flops.

Implanted resistors with implanted dielectric isolation can also be used instead of polysilicon resistors to harden the load means. In addition to implanting a dielectric under a Schottky or junction diode to harden diodes, some other techniques available for hardening diodes are (a) implanted polysilicon junction diodes, (b) Schottky diodes in recrystallized silicon over insulating substrate material, and (c) Schottky diodes in double epitaxial material, where the second epitaxial layer is grown in a V-shaped region surrounded by oxide with the original epitaxial layer as the floor. Presently, implanted dielectric under the Schottky diode is the preferred option.

Edge-triggered flip-flops are only one of three types of synchronous clocking schemes commonly used by logic designers. The other two are master-slave latches and multi-phase clocking with logic between the latches. Each of these clocking schemes can be implemented in various circuit families. The gated feedback cell can be used with any of these clocking schemes.

The choice of clocking scheme involves a tradeoff of system speed, clock skew problems, minimum path delays problems and ease of architectural design. The choice will be highly application dependent.

Figure 5:
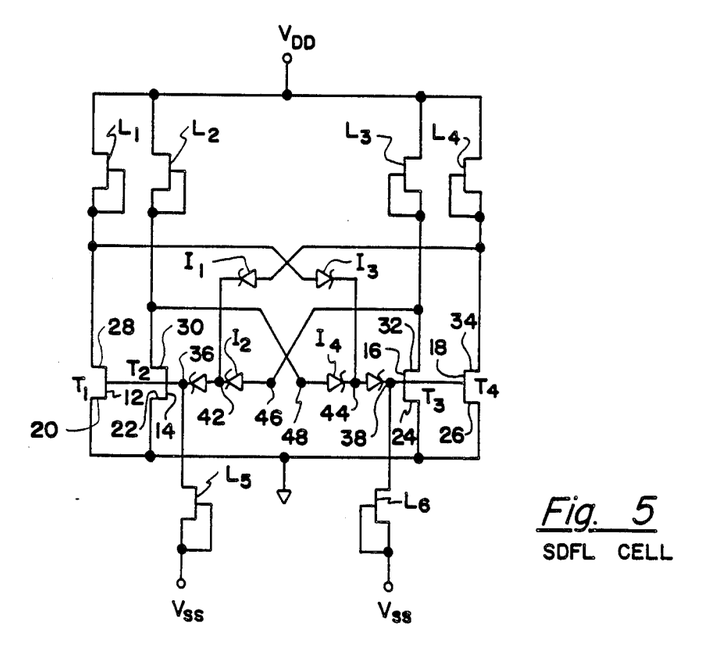
FIG. 5 is an Schottky diode field effect transistor (FET) logic (SDFL) version of the present invention.

FIG. 5 shows a version of the present invention applied to GaAs SDFL technology. READ and WRITE means are not shown. However various READ and WRITE means well known to those skilled in the art can be employed. FIG. 5 employs metal-semiconductor FETs in the depletion mode; however, enhancement mode FETs can be employed as well as modulation doped FET's (MODFET's).

When metal semiconductor field effect transistors (MESFETs) are employed, GaAs is the preferred substrate material; however, silicon or other semiconductor materials can be used for the substrate with the present invention.

Figure 6:
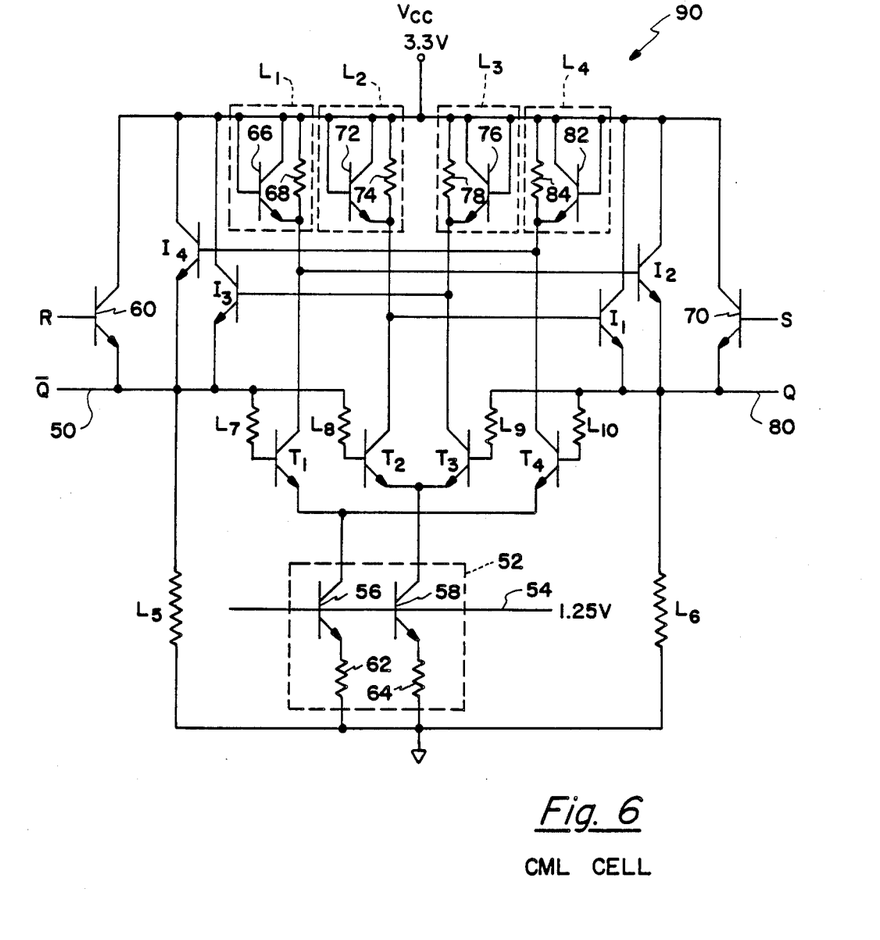
FIG. 6 is a current mode logic (CML) version of the present invention.

In FIG. 6 is a schematic of the invention embodied as an SEU hardened current mode logic (CML) latch 90. The element-designating nomenclature is similar to that of FIG. 2 to the extent of similarities of circuits 10 and 90. The two cross coupled pairs are shown as transistors $T_1/T_2$ and $T_3/T_4$, similarly illustrated in FIG. 2 and described above. Each load means $L_1$, $L_2$, $L_3$ and $L_4$, is connected between voltage $V_{cc}$ and a collector of a corresponding transistor, $T_1$, $T_2$, $T_3$ and $T_4$, respectively. Isolation means $I_1$, $I_2$, $I_3$ and $I_4$ are emitter followers (transistors with collectors at fixed voltages). Emitter followers $I_1$ through $I_4$ are relatively SEU hard since their collectors are tied to a low impedance voltage source. Therefore, collector-substrate heavy ion hits on emitter followers $I_1$ through $I_4$ have negligible effects on circuit 90. Protection from emitter-base and base-collector heavy ion hits is provided by isolation resistors $L_7$ through $L_{10}$.

Isolation means $I_1$, $I_2$, $I_3$ and $I_4$ correspondingly connect the collector of $T_2$ to line 80, the collector of $T_1$ to line 80, the collector of $T_3$ to line 50, and the collector of $T_4$ to line 50. Line 50 in connected to resistors $L_7$ and $L_8$ which, in turn, are connected to the bases of $T_1$ and $T_2$, respectively. Line 80 is connected to resistors $L_9$ and $L_{10}$ which, in turn, are connected to the bases of $T_3$ and $T_4$, respectively. Resistors $L_7$, $L_8$, $L_9$ and $L_{10}$, connecting isolation means $I_1$, $I_2$, $I_3$ and $I_4$ to respective transistors, $T_1$, $T_2$, $T_3$ and $T_4$, further harden the circuit against radiation, in additon to the redundancy of transistor pairs $T_1/T_2$ and $T_3/T_4$ and isolation means pairs $I_1/I_2$ and $I_3/I_4$. Resistors $L_7$, $L_8$, $L_9$ and $L_{10}$ harden the circuit or cell against SEU induced collector-base shorts. For instance, even though transistors $T_1$ through $T_4$ are placed in separate isolation regions, the transistors on one side of the cell share a common base node. Thus, collector-base current from one transistor can affect the base current of the other transistor on the same side of the cell, thus turning both OFF transistors ON at the same time. Base resistors $L_7$ through $L_{10}$ alleviate this problem of collector-base current effects because ion-produced SEU currents from one transistor must go through both resistors (e.g., $L_9$ and $L_{10}$) before affecting the second transistor on the same side of the cell.

One distinguishing characteristic of circuit 90 of the invention as illustrated in FIG. 6 is that it is a CML circuit having current sources 52 connected to the emitters of transistors $T_1$, $T_2$, $T_3$ and $T_4$ and to a ground or zero voltage reference. Current sources 52 comprise transistors 56 and 58 and resistors 62 and 64. The collector of transistor 56 is connected to the emitters of transistors $T_1$ and $T_4$ and the collector of transistor 58 is connected to the emitters of transistors $T_2$ and $T_3$. Resistor 62 connects the emitter of transistor 56 to a zero voltage reference or ground. Resistor 64 connects the emitter of transistor 58 to the zero voltage reference or ground. The bases of transistors 56 and 58 are connected to a voltage source having a voltage level between that of the zero voltage reference and voltage $V_{cc}$. The preferred voltage level at the bases of transistors 56 and 58 is 1.25 volts.

Resetting or setting latch 90 requires forcing current into the base of the OFF transistors via resistors $L_7$, $L_8$, $L_9$ or $L_{10}$. The reset or set current to the base of the OFF transistors is larger than the base current provided within the cell to the ON transistors. The reset or set is accomplished with transistors 60 and 70, respectively, coupled to lines 50 and 80, as shown in FIG. 6. The time for cell 90 to switch from one state to another is related to the time required to pull charge out of the base regions of the initially ON transistors (e.g., $T_3$ and $T_4$). When the initially OFF transistors are switched ON by the externally supplied base current pulse, the diode junctions on the collectors of these transistors become reversed-biased. Thus there is no way for the base charge of the initially ON transistros to be withdrawn unless one supplies a leakage path to ground which is accomplished by base pull-down load means comprising resistors $L_5$ and $L_6$.

The greatest SEU hardening feature of circuit 90 incorporates isolation means $I_1$, $I_2$, $I_3$ and $I_4$ which consist of NPN transistors having their collectors connected to the voltage $V_{cc}$. Voltage $V_{cc}$ is preferably 3.3 volts. Transistor $I_1$ has a base connected to the collector of transistor $T_2$ and an emitter ocnnected to line 80. Transistor $I_2$ has a base connected to the collector of transistor $T_1$ and an emitter connected to line 80. Transistor $I_3$ has a base connected to the collector of transistor $T_3$ and an emitter connected to line 50. Transistor $I_4$ has a base connected to the collector of $T_4$ and an emitter connected to line 50.

The signals controlling the transistors $T_1$ through $T_4$ are currents transmitted from transistors $I_1$ through $I_4$. Circuit 90 can survive a hit by an SEU. Assume that initially $T_3$ and $T_4$ are OFF, and that $T_3$ is hit by a heavy ion which funnels charge into its collector. Then the collector of $T_3$ is pulled to the potential of the emitter of $T_3$. Transistor $I_3$ is turned OFF isolating the collector of $T_3$ from rest of the circuit. Transistor $I_4$, however, stays on maintaining the base current of $T_1$ and $T_2$. Thus $T_1$ and $T_2$ stay ON, the collectors of $T_1$ and $T_2$ stay low and the emitters of $I_1$ and $I_2$ remain low. Transistor $T_4$ stays OFF ensuring that the state of the cell is not changed. As soon as the transient charge on the collector of $T_3$ is dissipated (e.g., 0.5 nanosecond), the potential at the collector to $T_3$ rises to the same voltage level as the collector of $T_4$. Circuit 90 will then have survived an SEU.

The same production process may be used for all the active elements of CML circuit 90 of FIG. 6. Isolation means $I_1$ through $I_4$ of circuit 90 are transistors that use a standard bipolar process thus not needing an insulating layer as required when utilizing diodes as isolation means.

Each load means $L_1$ through $L_4$ in FIG. 6 incorporates a transistor in addition to a resistor. The combination of a transistor with a resistor for load means $L_1$ through $L_4$ provides greater hardening of the circuit in contrast to load means $L_1$ through $L_4$ having only a resistor as in FIGS. 3 and 4. The reason is that the transistor functions as a diode clamp keeping the collector voltage above the emitter voltage of the respective transistor of transistors $T_1$ through $T_4$. An ion impinging one of the transistors $T_1$ through $T_4$ tends to cause the collector of the affected transistor to go negative thereby possibly resulting in an upset. The load transistor, e.g., 66, through a voltage clamping effecti of its base-emitter junction, functions to keep the voltage on the switching transistor collector up and above the voltage on the emitter of the same switching transistor, e.g., $T_1$, thereby making an upset less likely.

The configuration of load $L_1$ incudes transistor 66 having a base and a collector connected to voltage $V_{cc}$, and having an emitter connected to the collector of $T_1$, and resistor 68 connected from the emitter to the collector of transistor 66. Load $L_2$ has transistor 72 having a base and a collector connected to voltage $V_{cc}$, and having an emitter connected to the collector of $T_2$, and resistor 74 connected from the emitter to the collector of transistor 72. Load $L_3$ has transistor 76 having a base and a collector connected to voltage $V_{cc}$, and having an emitter connected to the collector of $T_3$, and resistor 78 connected from the emitter to the collector of transistor 76. Loan $L_4$ has transistor 82 having a base and a collector connected to voltage $V_{cc}$, and having an emitter connected to the collector of $T_4$, and resistor 84 connected from the emitter to the collector of transistor 82.

While a particular embodiment of the invention has been shown and described, it will be obvious to those skilled in the art that alternatives, changes and modifications may be made without departing from the invention in its broader aspects.

What is claimed is:

1. A solid-state gated feedback memory cell which will retain its current logic state despite the introduction of certain transient electrical signals at certain locations within said memory cell, comprising:

first, second, third and fourth switching means, each of said switching means having a first region, a second region and a control region, wherein said first and second regions are doped so as to be partially conductive and wherein said control region controls the flow of current between said first and second regions, wherein said first regions of said first and second switching means are connected at a first node and said first regions of said third and fourth switching means are connected at a second node;

first, second, third and fourth load means, wherein said first load means is connected to and between said second region of said first switching means and a third node, said second load means is connected to and between said second region of said second switching means and said third node, said third load means is connected to and between said second region of said third switching means and a fourth node and said fourth load means is connected to and between said second region of said fourth switching means and said fourth node;

first, second, third and fourth isolation means for controlling electrical signals applied to said control regions, where said first isolation means is coupled between the intersection of said first switching means, said first load means and the control regions of said third and fourth switching means, said second isolation means is coupled between the intersection of said second load means, said second switching means and the control regions of said third and fourth switching means, said third isolation means is coupled between the intersection of said fourth switching means, said fourth load means and the control regions of said first and second switching means, and said fourth isolation means is coupled between the intersection of said third load means, said third switching means and the control regions of said first and second switching means; and wherein said first and second nodes are connected to a first voltage reference point and said third and fourth nodes are connected to a second voltage reference point, so that different voltages may be applied to said first and second voltage reference points to supply electrical energy to said cell, and wherein said load means, said isolation means and said switching means form a bistable regenerative device with logic values provided at said second regions, and wherein if said transient electrical signals are introduced at only one of said second regions, the logic values of the remainder of said second regions will be unaffected.

2. The cell of claim 1 further including:

fifth load means connected to and between said control region of said first switching means and said first node, and to and between said control region of said second switching means and said first node; and sixth load means connected to and between said control region of said third switching means and said second node, and to and between said control region of said fourth switching means and said second node.

3. The cell of claim 2 wherein said switching means are field effect transistors, said first regions are sources of said transistors, said second regions are drains of said transistors and said control regions are gates of said transistors.

4. The circuit of claim 3 wherein said field effect transistors are metal-semiconductor field effect transistors (MESFETs).

5. The cell of claim 1 further including:

first and second common nodes wherein said first and second isolation means are connected in common at said first common node with said first isolation means connected to and between said second region of said first switching means and said first common node and said second isolation means connected to and between said second region of said second switching means and said first common node, and said third and fourth isolation means are connected in common at said second common node with said third isolation means connected to and between said second region of said fourth switching means and said second common node, and said fourth isolation means connected to and between said second region of said third switching means and said second common node.

6. The cell of claim 5 further including seventh, eighth, ninth and tenth load means, wherein said seventh load means is connected to and between said second common node and said control region of said first switching means, said eighth load means is connected to and between said second common node and said control region of said second switching means, said ninth load means is connected to and between said first common node and said control region of said third switching means and said tenth load means is connected to and between said first common node and said control region of said fourth switching means.

7. The memory cell of claim 1 wherein said switching means are bipolar transistors, said first regions are emitters of said transistors, said second regions are collectors of said transistors and said control regions are bases of said transistors.

8. The cell of claim 1 wherein said transient electrical signals are the result of readiation striking said cell and said certain locations are said second regions.

9. A radiation hard memory cell, comprising:

first and second pairs of cross coupled transistors configured as a bistable regenerative circuit, wherein said first pair of transistors are both in a first logic state under normal operating conditions and said second pair of transistors are both in a second logic state under normal operating conditions, and wherein each of said transistors has a logic node where the logic state of each of said transistors is determined; and means for allowing the logic state of any one of said transistors to remain unaffected if radiation causes the logic state of the other transistor paired with said any one of said transistors, to be temporarily changed, so that said bistable regenerative circuit will not be triggered to switch logic states due to said radiation striking only one of said logic nodes at any given time.

10. A radiation hard gated feedback memory cell comprising:

first pair of first and second switching means for switching a first logic state of said first pair from one value to another value from a set of two alternate values;

second pair of third and fourth switching means for switching a second logic state of said second pair from one value to another value being a value from a set of two alternate logic values, connected to said first pair in a configuration such that the value of said first logic state is unlike the value of said second logic state during about the same time, under normal operating conditions; and preventive means, connected to said first and second pairs, for preventing said first and second logic states from changing values due to radiation affecting either said switching means of said first or second pair.

11. A radiation hard gated feedback memory cell comprising:

a first transistor having a control region, and first and second regions;

a second transistor having a control region connected to said control region of said first transistor, having a first region connected to said first region of said first transistor, and having a second region;

a third transistor having a first region connected to said first region of said second transistor, having a control region and a second region;

a fourth transistor having a control region connected to said control region of said third transistor, having a first region connected to said first region of said third transistor, and having a second region;

a first rectifier coupling said second region of said first transistor and said control regions of said third an fourth transistors;

a second rectifier coupling said second region of said second transistor and said control regions of said third and fourth transistors;

a third rectifier coupling said second region of said fourth transistor and said control regions of said first and seocnd transistors;

a fourth rectifier coupling said second region of said third transistor and said control regions of said first and second transistors;

a first node connected to said first regions of said first, second, third and fourth transistors;

a second node;

a first load coupling said second node and said second region of said first transistor;

a second load coupling said second node and said second region of said second transistor;

a third load coupling said second node and said second region of said third transistor; and a fourth load coupling said second node and said second region of said fourth transistor.

12. Apparatus of claim 11 further comprising:
a fifth load coupling said first node and said control region of said second transistor; and
a sixth load coupling said first node and said control region of said third transistor.

13. Apparatus of claim 12 wherein each of said loads comprises a transistor configured as an active load.

14. Apparatus of claim 13 wherein:
said first rectifier is a diode having an anode connected to said second region of said first transistor and having a cathode connected to said control regions of said third and fourth transistors;
said second rectifier is a diode having an anode connected to said second region of said second transistor and having a cathode connected to said control regions of said third and fourth transistors;
said third rectifier is a diode having an anode connected to said second region of said fourth transistor and a cathode connected to said control regions of said first and second transistors; and
said fourth rectifier is a diode having an anode connected to said second region of said third transistor and having a cathode connected to said control regions of said first and second transistors.

15. Apparatus of claim 14 wherein each of said transistors is a bipolar transistor wherein said control region is a base, said first region is an emitter and said second region is a collector.

16. Appartus of claim 14 wherein each of said transistors is a field effect transistor wherein said control region is a gate, said first region is a source and said second region is a drain.

17. Apparatus of claim 16 wherein:
said transistors are metal-semiconductor field effect transistors; and
said diodes are Schottky diodes.

18. Apparatus of claim 17 wherein said circuit is integrated in a gallium arsenide substrate.

19. Apparatus of claim 12 wherein each of said transistors has a load means inserted and connected between said control region and external connection and has a load means connected between said external connection and said first node.

20. Apparatus of claim 11 wherein:
said first node is connected to a first voltage potential; and
said second node is connected to a second voltage potential.

21. A radiation hard memory cell comprising:
current source means for providing current;
first switching means for switching electrical signals, connected to said current source means;
second switching means for switching electrical signals, connected to said current source means;
third switching means for switching electrical signals, connected to said current source means;
fourth switching means for switching electrical signals, connected to said current source means;
a first node;
first load means for providing an electrical load, connected to said first node and to said first switching means;
second load means for providing an electrical load, connected to said first node and to said second switching means;
third load means for providing an electrical load, connected to said first node and to said third switching means;
fourth load means for providing an electrical load, connected to said first node and to said fourth switching means;
first isolation means for isolating certain signals between said first switching means and said third and fourth switching means, connected to said first switching means and to said third and fourth switching means;
second isolation means for isolating certain signals between said second switching means and said third and fourth switching means, connected to said second switching means and to said third and fourth switching means;
third isolation means for isolating certain signals between said third switching means and said first and second switching means, connected to said third switching means and to said first and second switching means; and
fourth isolation means for isolating certain signals between said fourth switching means and said first and second switching means, connected to said fourth switching means and to said first and second switching means.

22. Apparatus of claim 21 further comprising:
a second node connected to said third and fourth isolation means, and to said first and second switching means; and
a third node connected to said first and second isolation means, and to said third and fourth switching means.

23. Apparatus of claim 22 wherein:
said first isolation means comprises a first transistor having a collector connected to said first node, having a base connected to said first switching means, and having an emitter connected to said third node;
said second isolation means comprises a second transistor having a collector connected to said first node, having a base connected to said second switching means, and having an emitter connected to said third node;
said third isolation means comprises a third transistor having a collector connected to said first node, having a base connected to said third switching means, and having an emitter connected to said second node; and
said fourth isolation means comprises a fourth transistor having a collector connected to said first node, having a base connected to said fourth switching means, and having an emitter connected to said second node.

24. Apparatus of claim 23 wherein:
said first switching means comprises:

a fifth transistor having a collector connected to said first load means and to the base of said first transistor, having a emitter connected to said current source means, and having a base; and a first resistor connected between the base of said fifth transistor and said second node;

said second switching means comprises:

a sixth transistor having a collector connected to said second load means and to the base of said second transistor, having an emitter connected to said current source means, and having a base; and a second resistor connected between the base of said sixth transistor and said second node;

said third switching means comprises:

a seventh transistor having a collector connected to said third load means and to the base of said third transistor, having an emitter connected to said current source means, and having a base; and a third resistor connected between the based of said seventh transistor and said third node; and said fourth switching means comprises:

an eighth transistor having a collector connected to said fourth load means and to the base of said fourth transistor, having an emitter connected to said current source means, and having a base; and a fourth resistor connected between the base of said eighth transistor and said third node.

25. Apparatus of claim 24 wherein:

said first load means comprises:

a ninth transistor having a collector connected to said first node, having a base connected to said first node, and having an emitter connected to the collector of said fifth transistor; and a fifth resistor connected between the collector and the emitter of said ninth transistor;

a second load means comprises:

a tenth transistor having a collector connected to said first node, having a base connected to said first node, and having an emitter connected to the collector of said sixth transistor; and a sixth resistor connected between the collector and the emitter of said tenth transistor;

said third load means comprises:

an eleventh transistor having a collector connected to said first node, having a base connected to said first node, and having an emitter connected to the collector of said seventh transistor; and a seventh resistor connected between the collector and the emitter of said eleventh transistor; and said fourth load means comprises:

a twelfth transistor having a collector connected to said first node, having a base connected to said first node, and having an emitter connected to the collector of said eighth transistor; and a eighth resistor connected between the collector and the emitter of said twelfth transistor.

26. Apparatus of claim 25 comprising:

a fourth node connected to said current source means;

a ninth resistor connected between said second and fourth nodes; and a tenth resistor connected between said third and fourth nodes.

27. Apparatus of claim 26 comprising:

a reset means for resetting said memory cell, connected to said first and second nodes; and a set means for setting said memory cell, connected to said first and third nodes.

28. Apparatus of claim 27 wherein said current source means comprises:

a thirteenth transistor having a collector connected to the emitters of said fifth and eighth transistors, having a base and having an emitter;

an eleventh resistor connected between the emitter of said thirteenth transistor and said fourth node;

a fourteenth transistor having a collector connected to the emitters of said sixth and seventh transistors, having a base connected to the base of said thirteenth transistor, and having an emitter; and a twelfth resistor connected between the emitter of said fourteenth transistor and said fourth node.

29. Apparatus of claim 28 wherein:

said reset means comprises a fifteenth transistor having a collector connected to said first node, having an emitter connected to said second node, and having a base; and said set means comprises a sixteenth transistor having a collector connected to said first node, having an emitter connected to said third node, and having a base.

30. Apparatus of claim 29 wherein:

said fourth node is connected to a first reference voltage;

the bases of said thirteenth and fourteenth transistors are connected to a second reference voltage having a potential more positive than said first reference voltage, so that said current source means functions appropriately;

said first node is connected to a third reference voltage having a potential more positive than said second reference voltage, so that said radiation hard memory cell functions appropriately;

said third node is an output node of said memory cell;

said second node is a complementary output node of said memory cell;

the base of said sixteenth transistor is a set input of said memory cell; and the base of said fifteenth transistor is a reset input of said memory cell.

* * * * *